(12) United States Patent
Shibata et al.

(10) Patent No.: US 7,286,742 B2
(45) Date of Patent: Oct. 23, 2007

(54) TEST APPARATUS AND CABLE GUIDE UNIT

(75) Inventors: Masashi Shibata, Tokyo (JP);
Toshiyuki Okayasu, Tokyo (JP);
Tsutomu Akiyama, Tokyo (JP)

(73) Assignees: Advantest Corporation, Tokyo (JP);
The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/415,372

(22) Filed: May 1, 2006

(65) Prior Publication Data
US 2006/0257093 A1 Nov. 16, 2006

Related U.S. Application Data

(63) Continuation of application No. PCT/JP2004/015949, filed on Oct. 27, 2004.

(30) Foreign Application Priority Data
Nov. 5, 2003 (JP) .............................. 2003-376139

(51) Int. Cl.
*G02B 6/00* (2006.01)
(52) U.S. Cl. ...................... 385/135; 385/136; 385/137
(58) Field of Classification Search ......... 385/135–137
See application file for complete search history.

(56) References Cited

U.S. PATENT DOCUMENTS

| | | | | |
|---|---|---|---|---|
| 4,858,424 A | * | 8/1989 | Loding et al. | ............... 59/78.1 |
| 5,240,209 A | * | 8/1993 | Kutsch | ........................ 248/49 |
| 5,335,349 A | * | 8/1994 | Kutsch et al. | ............... 375/257 |
| 6,243,526 B1 | * | 6/2001 | Garibay et al. | ............. 385/135 |
| 6,793,259 B2 | * | 9/2004 | Sano et al. | ................. 296/155 |
| 2004/0170369 A1 | * | 9/2004 | Pons | ........................ 385/135 |
| 2006/0115223 A1 | * | 6/2006 | Ono et al. | .................. 385/115 |

FOREIGN PATENT DOCUMENTS

| | | |
|---|---|---|
| JP | 2-148103 | 12/1990 |
| JP | 7-92331 | 4/1995 |
| JP | 2000-89038 | 3/2000 |
| JP | 2002-189037 | 7/2002 |
| JP | 2003-43935 | 2/2003 |

OTHER PUBLICATIONS

International Search Report issued for International Application No. PCT/JP2004/015949 mailed on Dec. 14, 2004 and English translation thereof, 4 pages.

* cited by examiner

*Primary Examiner*—Michelle Connelly-Cushwa
*Assistant Examiner*—Rhonda S. Peace
(74) *Attorney, Agent, or Firm*—Osha Liang LLP

(57) ABSTRACT

A test apparatus includes a test head including a plurality of test boards for applying a test pattern to a device under test, a main frame for controlling a test sequence by the test head, and a fiber optic cable unit including a plurality of flat cables for optically coupling the test head and the main frame, a plurality of fiber optic cables, a dam for coupling the fiber optic cable unit and the plurality of fiber optic cables, a circumferential difference absorption apparatus for absorbing the difference in circumferential length between the plurality of flat cables of the fiber optic cable unit, and a cable guide unit for bending and holding the fiber optic cables coupled to the test board of the main frame.

11 Claims, 5 Drawing Sheets

TEST APPARATUS AND CABLE GUIDE UNIT

CROSS REFERENCE TO RELATED APPLICATION

This is a continuation application of PCT/JP2004/015949 filed on Oct. 27, 2004 which claims priority from a Japanese Patent Application No. JP 2003-376139 filed on Nov. 5, 2003, the contents of which are incorporated herein by reference.

BACKGROUND OF THE INVENTION

1. Field of the Invention

The present invention relates to a test apparatus and a cable guide unit. Particularly, the present invention relates to a technique for cable installation, thereby satisfying the curvature restriction of a plurality of fibre optic cables.

2. Description of the Related Art

With recent speed improvement of electronic devices, it is desirable that the operation speed of a test apparatus for testing the electronic devices is also high. Accordingly, in order to realize high-speed transmission of a test or control signal, it has been recently proposed that a test head for applying a test pattern to a device under test and a main frame for controlling a test sequence of the test head are coupled by a fibre optic cable. Since no prior art documents related to the present invention have been found, the explanation regarding such documents will be omitted.

When a fibre optic cable is used for a signal transmission line, it is required to satisfy the curvature restriction of the fibre optic cable, and particularly there is a crucial problem that the line is connected to a moving device such as the test head. Moreover, there is a problem that the curvature restriction of a plurality of fibre optic cables installed in narrow space such as the test head should be satisfied.

SUMMARY OF THE INVENTION

Therefore, it is an object of the present invention to provide a test apparatus and a cable guide unit, which is capable of overcoming the above drawbacks accompanying the conventional art. The above and other objects can be achieved by combinations described in the independent claims. The dependent claims define further advantageous and exemplary combinations of the present invention.

According to a first embodiment of the present invention, a test apparatus for testing a device under test includes a test head for applying a test pattern to the device under test, a main frame for controlling a test sequence of the test head; and a fibre optic cable unit for optically coupling the main frame and the test head. The fibre optic cable unit includes a cable group comprising a plurality of fibre optic cables layered in an overlapped direction, where the fibre optic cable comprises a plurality of fibre optic cores arranged in an arrangement direction, and a cable containing chain for holding the layered plurality of fibre optic cables so that said fibre optic cables can slide each other, where the cable containing chain is bendable in the overlapped direction. A minimum bending radius of the cable containing chain may be larger than an allowable bending radius of the fibre optic cable.

The fibre optic cable unit may further comprise a slide sheet provided between the layered plurality of fibre optic cables, where the slide sheet holds the layered plurality of fibre optic cables so that the plurality of fibre optic cables can slide each other. The cable group may comprise a first cable layer including a plurality of fibre optic cables arranged in the arrangement direction, and a second cable layer including a plurality of fibre optic cables arranged in the arrangement direction, where the second cable layer is layered on the first cable layer in the overlapped direction, and the slide sheet is provided between said first and second cable layers.

The test apparatus may further comprise a circumferential difference absorption apparatus for adjusting difference in circumferential length between the plurality of fibre optic cables with respect to a part of a section of the plurality of fibre optic cables not contained in the cable containing chain and absorbing difference in circumferential length between the plurality of fibre optic cables. The circumferential difference absorption apparatus may fix the cable containing chain, hold the plurality of fibre optic cables with respect to a part of the section of the plurality of fibre optic cables not contained in the cable containing chain so that the fibre optic cables are bent, and form space between the plurality of fibre optic cables with respect to the bending section of the plurality of fibre optic cables, thereby absorbing the difference in circumferential length between the plurality of fibre optic cables.

According to a second embodiment of the invention, a cable guide unit for holding a plurality of fibre optic cables in a bent state, where the fibre optic cables are respectively coupled to a plurality of connectors of a fibre optic cable connection board, and the connectors are arranged in an arrangement direction. The cable guide unit comprises a plurality of cable hanger members for respectively bending and holding the plurality of fibre optic cables so that a minimum curvature radius of the cable hanger member is larger than an allowable bending radius of the fibre optic cable. The cable hanger member may have a shape of a substantially one-quarter arc, a radius of which is larger than the allowable bending radius of the fibre optic cable, and bend and hold the fibre optic cable from a coupling direction, which is directed from the connector to the fibre optic cable, to the arrangement direction. The plurality of cable hanger members may be provided in the arrangement direction at substantially same arrangement intervals as those of the plurality of connectors. The plurality of cable hanger members may be arranged in the coupling direction on positions shifted by narrower intervals than the arrangement intervals in the arrangement direction.

The cable guide unit further comprises a first cable hanger member group comprising the plurality of cable hanger members, and a second cable hanger member group comprising the plurality of cable hanger members. The first cable hanger member group may be provided higher than the second cable hanger member group along the arrangement direction, and the plurality of fibre optic cables bent by the first cable hanger member group may pass by the second cable hanger member group and be led out of the cable guide unit.

The cable hanger member of the second cable hanger member group may have narrower width than that of the cable hanger member of the first cable hanger member group, and the plurality of fibre optic cables bent by the first cable hanger member group may pass by the second cable hanger member group and be led out of the cable guide unit. The cable guide unit may further comprise a clamp member for tying up the plurality of fibre optic cables bent by the first cable hanger member group and the plurality of fibre optic cables bent by the second cable hanger member group and leading the fibre optic cables out of the cable guide unit.

Here, all the necessary features of the present invention are not listed in the above disclosure. The sub-combinations of the features may become the invention.

According to the present invention, it is possible to provide a cable installation technique by which satisfying the curvature restriction of a plurality of fibre optic cables.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
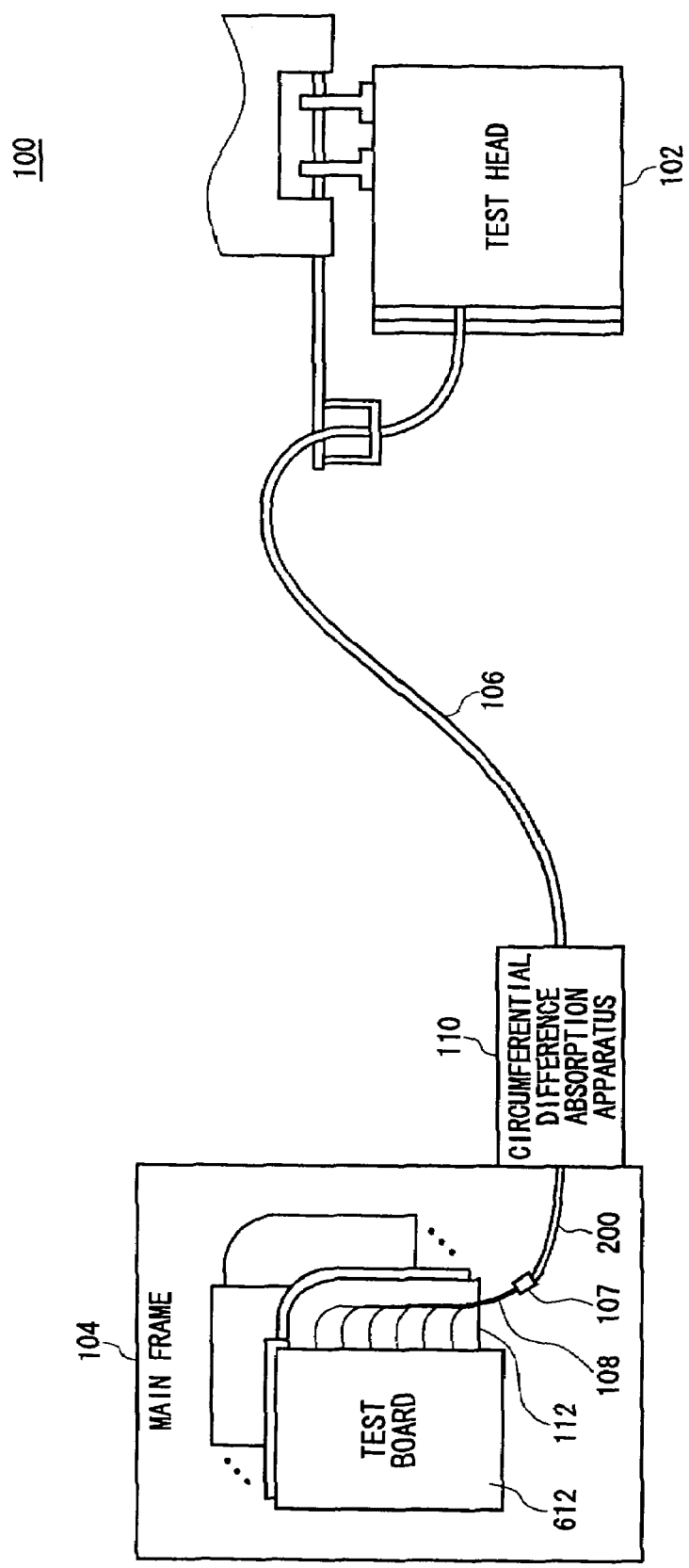
FIG. 1 shows an exemplary configuration of a test apparatus 100.

FIG. 1 shows an exemplary configuration of a test apparatus 100 related to an embodiment of the present invention. It is an object of the test apparatus 100 of the present embodiment to satisfy the curvature restriction of fibre optic cables which perform signal transmission between a test head 102 and a main frame 104 and thus to prevent the fibre optic cables from being damaged. Moreover, it is another object of the test apparatus 100 particularly to adjust the difference in circumferential length between a plurality of fibre optic cables coupled to a moving device such as the test head 102 and to satisfy the curvature restriction of the plurality of fibre optic cables installed in narrow space such as the main frame 104.

The test apparatus 100 includes a test head 102 including a plurality of test boards for applying a test pattern to a device under test, a main frame 104 for controlling a test sequence of the test head 102, a fibre optic cable unit 106 including a plurality of flat cables 200 which optically couple the test head 102 and the main frame 104, a plurality of fibre optic cables 108, a dam 107 for coupling the fibre optic cable unit 106 and the plurality of fibre optic cables 108 with different structures, a circumferential difference absorption apparatus 110 for absorbing the difference in circumferential length between the plurality of flat cables 200 included in the fibre optic cable unit 106, and a cable guide unit 112 for bending and holding the fibre optic cables 108 coupled to a test board 612 included in the main frame 104.

According to the test apparatus 100 related to the present embodiment, even though the difference in circumferential length between the plurality of flat cables 200 occurs due to the movement of the test head 102 when a test board is attached or detached to or from the test head 102, the device under test is attached or detached to or from a handling apparatus, etc., it is possible to absorb the difference by using the circumferential difference absorption apparatus 110. Moreover, by holding the plurality of fibre optic cables 108 coupled to the test board 612 included in the main frame 104 using the cable guide unit 112, it is possible to satisfy the curvature restriction of the fiver optic cables 108, thereby realizing the prevention of the breakage of them and the reduction of losses of the signal transmission level.

Figure 2A:
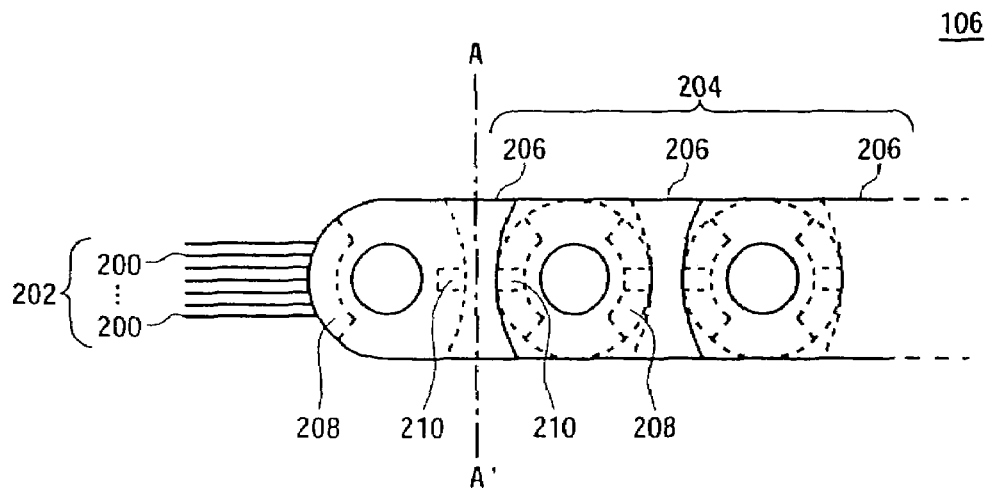
FIG. 2 shows an exemplary configuration of a fibre optic cable unit 106.
Figure 2B:
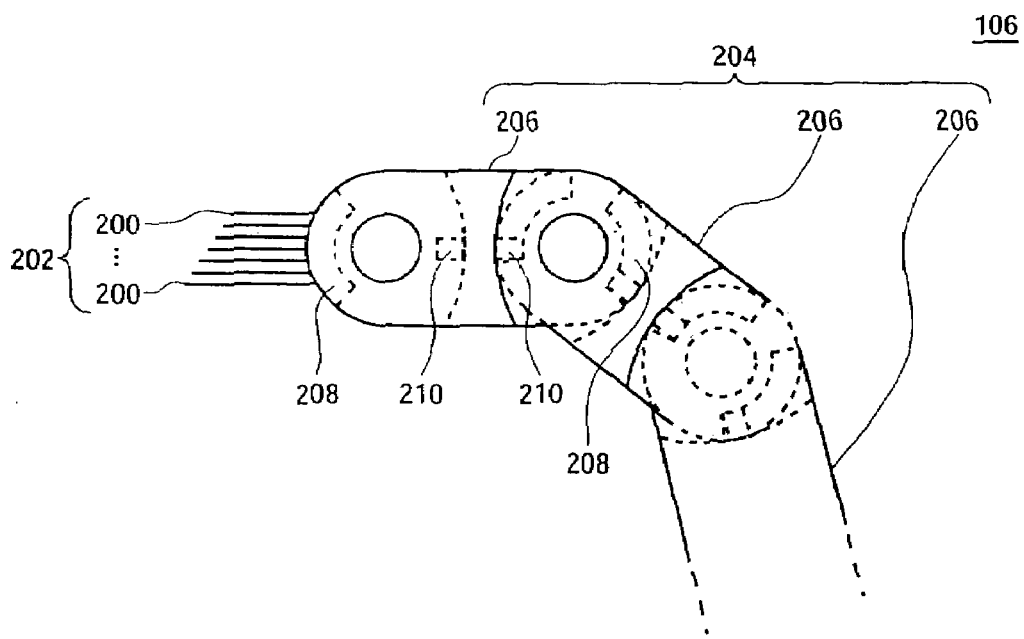
Figure 2C:
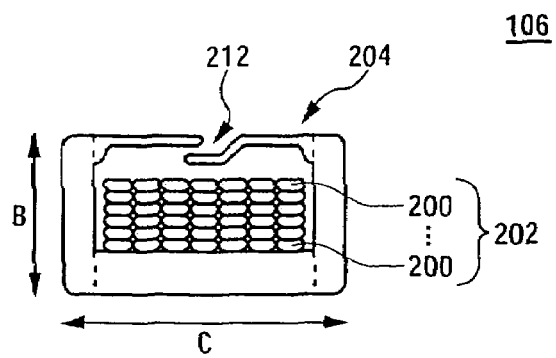

FIG. 2 shows an exemplary configuration of the fibre optic cable unit 106 related to the present embodiment. FIGS. 2A and 2B are side views of the fibre optic cable unit 106, and FIG. 2C is a cross-sectional view of the fibre optic cable unit 106 along AA'. Further, FIG. 2A shows the fibre optic cable unit 106 which is not bent, and FIG. 2B shows the unit 106 being bent.

The fibre optic cable unit 106 includes a flat cable group 202 including a plurality of flat cables layered in an overlapped direction B, and a cable containing chain 204, which can be bent in the overlapped direction B, for holding the layered plurality of flat cables 200 so that they can slide each other. The cable containing chain is provided to protect the flat cables 200 transmitting electronic or optical signals by surrounding them and prevent them from being damaged.

As shown in FIGS. 2A and 2B, the cable containing chain 204 is configured so that a plurality of pieces 206 are rotatably connected to each other. Each of the plurality of pieces 206 includes a groove 208 and a claw 210 respectively provided on the left and right, and the groove 208 of one piece 206 is fitted with the claw 210 of another adjacent piece 206. Accordingly, since the movement of the claw 210 of each piece 206 and is restricted to the range of the groove 208 of another adjacent piece 206, the bending angle between the adjacent pieces 206 is limited. Consequently, the minimum bending radius of the cable containing chain 204 is limited. It is desirable that the minimum bending radius of the cable containing chain 204 is larger than an allowable bending radius of the plurality of flat cables 200 which is acceptable for the cable containing chain 204, and thus it is possible to maintain the bending radius of the plurality of flat cables 200 to be larger than the allowable bending radius. The allowable bending radius of the flat cables 200 is, for example, 50 mm.

Moreover, as shown in FIG. 2C, the flat cable 200 has a plurality of fibre optic cables tied together in an arrangement direction C and including a plurality of fibre optic cores arranged in the arrangement direction C. Moreover, the cable containing chain 204 has a rear split section 212 at a side face thereof in the overlapped direction B, where the cable containing chain 204 is split along a longitudinal direction thereof. Accordingly, the cable containing chain 204 can have flexibility against the twist of the fibre optic cable unit 106.

Further, it is desirable that the cable containing chain 204 leaves space where the flat cables 200 are not layered in the overlapped direction B so as to layer and hold the flat cables 200. It is desirable that the cable containing chain 204 layers and holds the flat cables 200 at the most 60% of the width of the space which the cable containing chain 204 has in the overlapped direction B. Since the cable containing chain 204 has room in the overlapped direction B so as to hold the flat cables 200, the flat cables 200 freely slide each other, thereby reducing the influence on the flat cables 200 caused by the twist occurring in the cable containing chain 204.

Figure 3:
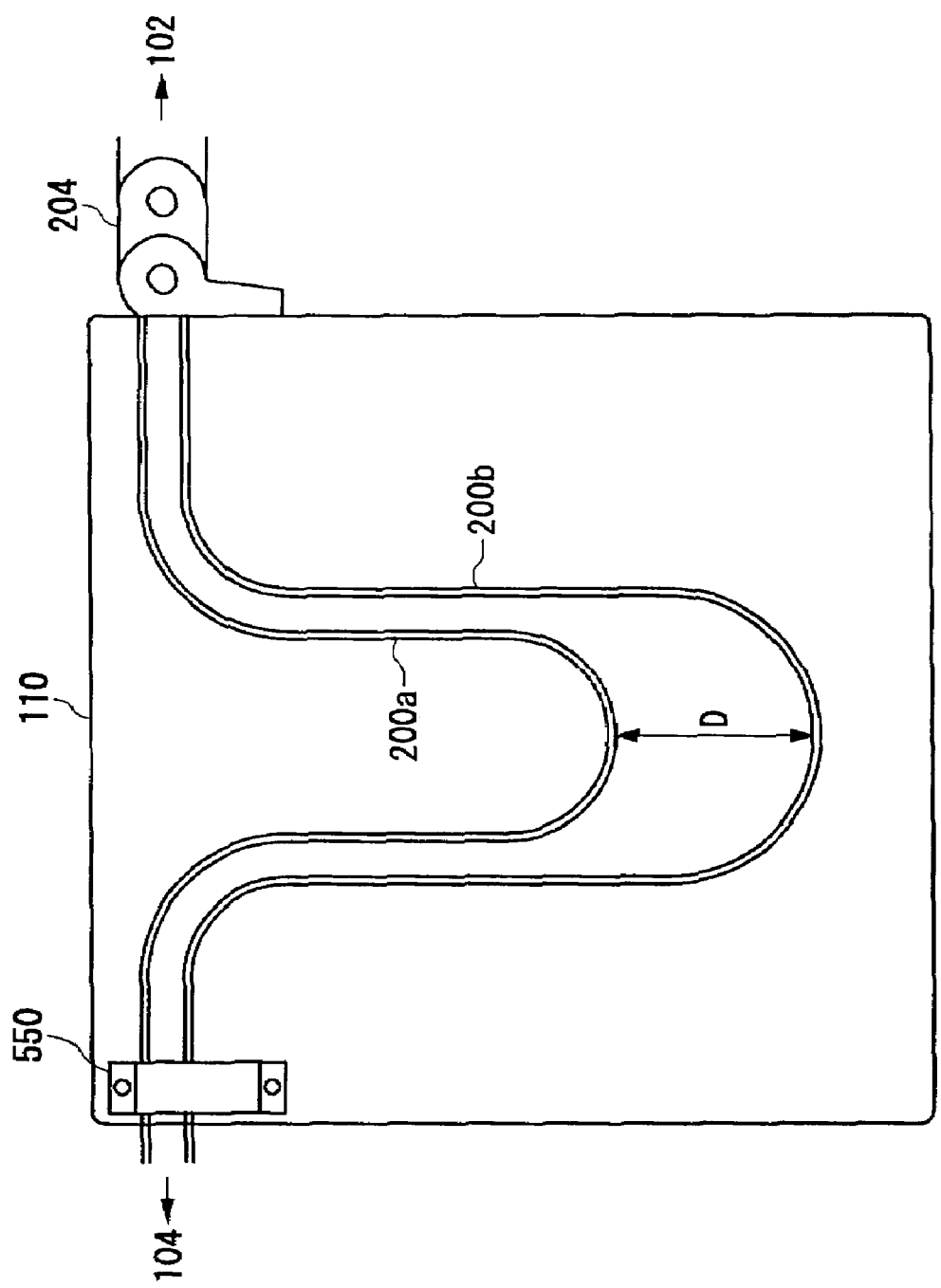
FIG. 3 shows an exemplary configuration of a circumferential difference absorption apparatus 110.

FIG. 3 shows an exemplary configuration of the circumferential difference absorption apparatus 110 related to the present embodiment. The circumferential difference absorption apparatus 110 adjusts the difference in circumferential length between the plurality of flat cables 200a and 200b with respect to a part of a section of the plurality of flat cables 200a and 200b not contained in the cable containing chain and absorbs the difference in circumferential length with respect to the entire length of the plurality of flat cables 200a and 200b.

The circumferential difference absorption apparatus 110 fixes the end of the cable containing chain 204 and leads a part of the section not contained in the cable containing chain 204 from the cable containing chain 204 to the circumferential difference absorption apparatus 110. Moreover, the circumferential difference absorption apparatus 110 holds the plurality of flat cables 200a and 200b therein so that they are bent with different curvature from each other with respect to a part of the section of the flat cables 200a and 200b not contained in the cable containing chain 204. Moreover, the circumferential difference absorption apparatus 110 ties up the plurality of flat cables 200a and 200b with a clamp member 550 and leads them out of the circumferential difference absorption apparatus 110. The main frame 104 fixes the plurality of flat cables 200a and 200b.

Since the circumferential difference absorption apparatus 110 forms space between the plurality of flat cables 200a and 200b with respect to the bending section of the plurality of flat cables 200a and 200b, it can absorb the difference in circumferential length due to the difference in the bending radius between the plurality of flat cables 200a and 200b which the fibre optic cable unit 106 has. Here, the distance D of the space of the plurality of flat cables 200a and 200b in the circumferential difference absorption apparatus 110 is calculated on the basis of a bending angle at which the fibre optic cable unit 106 might be bent. For example, if the bending angle of the fibre optic cable unit 106 is 180 degrees, in order for the flat cables 200a and 200b move in opposite directions to each other, by setting the distance D to be 50% of the difference in circumferential length between the flat cables 200a and 200b, it is possible to prevent collision even if the flat cables 200a and 200b are close.

Figure 4A:
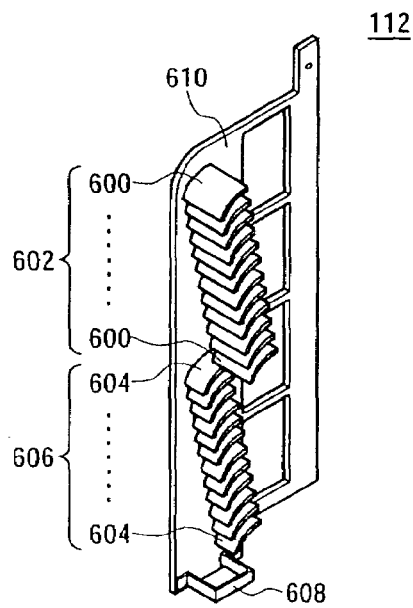
FIG. 4 shows an exemplary configuration of a cable guide unit 112.
Figure 4B:
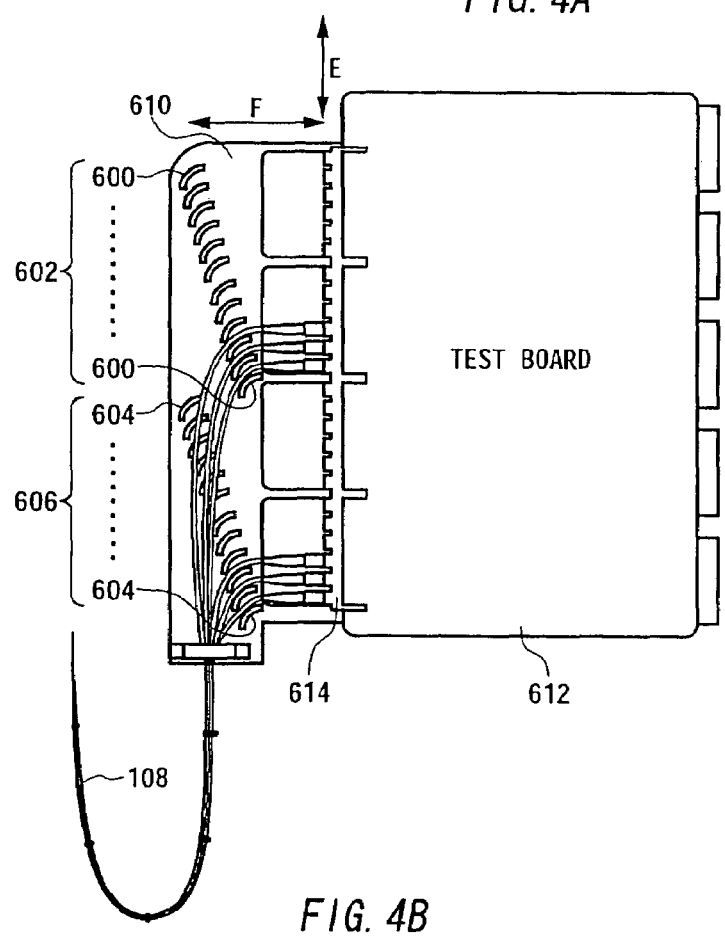
Figure 4C:
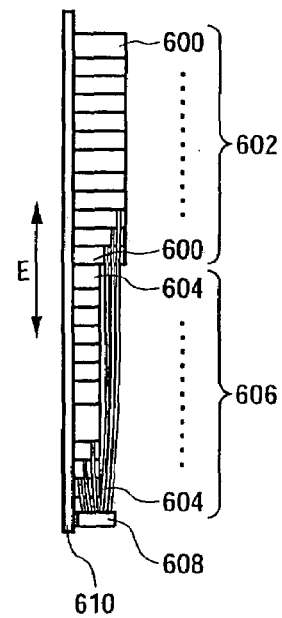

FIG. 4 shows an exemplary configuration of the cable guide unit 112 related to the present embodiment. A perspective view of the cable guide unit 112 is shown in FIG. 4A, a side view thereof is shown in FIG. 4B, and a rear view thereof is shown in FIG. 4C.

The cable guide unit 112 includes a plurality of cable hanger members 600 and 604 for holding the plurality of fibre optic cables 108 respectively coupled to a plurality of connectors 614 of the test board 612 so that the fibre optic cables 108 are bent in the same direction, a clamp member 608 for tying up the plurality of fibre optic cables 108 respectively bent by the plurality of cable hanger members 600 and 604 to lead them out of the cable guide unit 112, and a cable hanger holding plate 610 for holding the cable hanger members 600 and 604 as well as the clamp member 608 to be coupled to the test board 612. The test board 612 is an example of a fibre optic cable connection board of the present invention and includes a plurality of connectors 614 disposed in an arrangement direction E. Further, the main frame 104 holds a plurality of test boards 612 in the thickness direction of the test board 612 in order that they can be detachable.

The minimum curvature radius of the cable hanger members 600 and 604 is larger than the allowable bending radius of the fibre optic cables 108, and the cable hanger members 600 and 604 hold the fibre optic cables 108 so that the curvature restriction of the fibre optic cables 108 can be satisfied. Specifically, each of the cable hanger members 600 and 604 has the shape of a one-quarter arc cut out of a cylinder, the radius of which is larger than the allowable bending radius of the fibre optic cables 108, and bends and holds the fibre optic cable 108 from a coupling direction F, which is directed from the connector 614 to the fibre optic cable 108, to the arrangement direction E. For example, if the allowable bending radius of the cable hanger members 600 and 604 is 30 mm, the cable hanger members 600 and 604 have the shape of a one-quarter arc, the radius of which is 30 mm or more.

As shown in FIG. 4B, the plurality of cable hanger members 600 and 604 are arranged so that they are overlapped each other. Specifically, the plurality of the cable hanger members 600 and 604 are provided in the arrangement direction E at the same intervals as those of the plurality of connectors 614. Moreover, the plurality of cable hanger members 600 and 604 are arranged in the coupling direction F on the positions shifted by narrower intervals than the arrangement intervals in the arrangement direction E. Accordingly, it is possible to narrow an installation range in the coupling direction F of the plurality of fibre optic cables 108.

Moreover, the cable guide unit 112 includes a first cable hanger member group 602 including the plurality of cable hanger members 600 and a second cable hanger member group 606 including the plurality of cable hanger members 604. The first cable hanger member group 602 is provided on a position far from the clamp member 608 which is the bending end of the plurality of fibre optic cables 108, while the second cable hanger member group 606 is provided on a position close to the clamp member 608. That is, the first cable hanger member group 602 is provided on a position higher than that of the second cable hanger member group 606 in the arrangement direction E. For example, the first cable hanger member group 602 is provided at twice the height of the second cable hanger member group 606.

Accordingly, as shown in FIGS. 4B and 4C, the plurality of fibre optic cables 108 respectively bent by the plurality of cable hanger members 600 included in the first cable hanger member group 602 pass by the plurality of cable hanger members 604 included in the second cable hanger member group 606 and are led out of the cable guide unit 112. Moreover, the clamp member 608 ties up the plurality of fibre optic cables 108 bent by the first cable hanger member group 602 and the plurality of fibre optic cables 108 bent by the second cable hanger member group 606 and leads them out of the cable guide unit 112. Since the clamp member 608 can push the fibre optic cables 108 which are hanged down by the weight thereof, it is possible to maintain the plurality of fibre optic cables 108 in order that the curvature restriction thereof can be satisfied.

Further, as shown in FIG. 4C, the cable hanger members 604 included in the second cable hanger member group 606 have a narrower width of a section which holds the fibre optic cables 108 than that of the cable hanger members 600 included in the first cable hanger member group 602. Accordingly, an area required to install the fibre optic cables 108 can be small, and even in a restricted environment where the plurality of test boards 612 are arranged in parallel, a number of fibre optic cables 108 can be properly installed. Moreover, it is desirable that the width of the cable hanger member 600 included in the first cable hanger member group 602 is narrower than that of the test board 612. Accordingly, the attachment and detachment of the adjacent test boards 612 is not affected by the cable hanger members 600.

According to the test apparatus 100 related to the present embodiment, using the fibre optic cable unit 106 and the cable guide unit 112 described above, it is possible to satisfy the curvature restriction of the flat cables 200 and the fibre optic cables 108 and prevent the crack or breakage of the cables as well as to reduce the losses of the signal transmission level. Moreover, by absorbing the difference in circumferential length between the plurality of flat cables 200 in the circumferential difference absorption apparatus 110, the plurality of flat cables 200 can freely slide inside the cable containing chain 204, and the stress concentration on the flat cable 200 can be avoided. Further, the circumferential difference absorption apparatus 110 and the cable containing chain 204 can protect the cables by restricting the degree of freedom of the cables inside the confined free space, and the cable guide unit 112 can satisfy the curvature with the narrow space to adjust the cables, so they can be effectively used even in installation of cables less than fibre optic cables.

Figure 5:
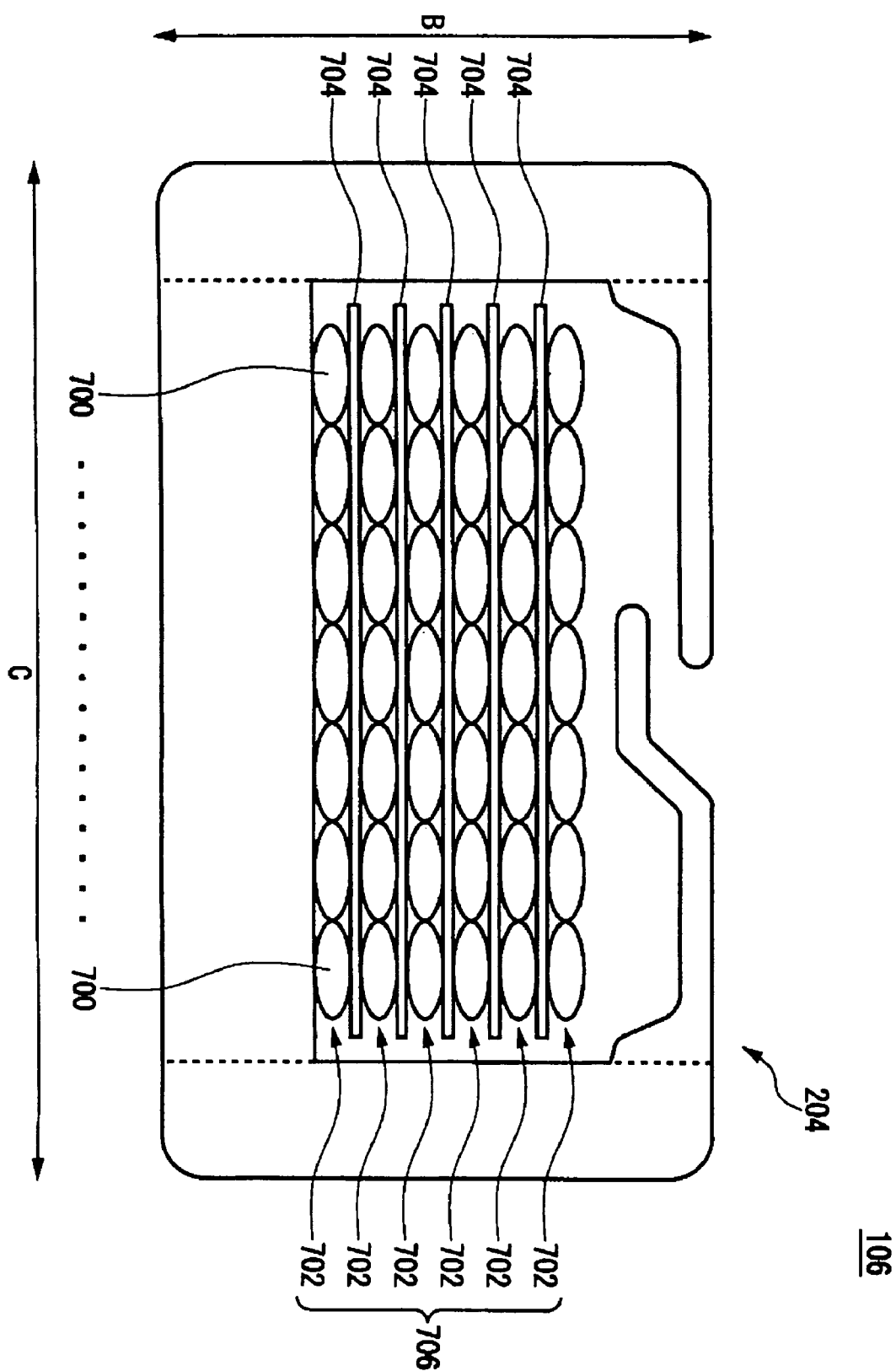
FIG. 5 shows an exemplary configuration of the fibre optic cable unit 106.

FIG. 5 shows a modification example of the configuration of the fibre optic cable unit 106 related to the present embodiment. The fibre optic cable unit 106 related to the present modification example has the same configurations and functions as the fibre optic cable unit 106 shown in FIG. 2, except for the features described in the following part. Therefore, the fibre optic cable unit 106 related to the modification example is not explained in full detail here.

The fibre optic cable unit 106 related to the present modification example includes a cable group 706, the cable containing chain 204, and slide sheets 704. The cable group 706 has therein a plurality of fibre optic cables 700 each of which includes a plurality of fibre optic cores arranged in the arrangement direction C are layered in the overlapped direction B. The cable containing chain 204 holds therein the layered fibre optic cables 700 in such a manner that the fibre optic cables 700 can slide relative to each other. Here, the cable containing chain 204 can be bent in the overlapped direction B. The slide sheet 704 is provided between the layered fibre optic cables 700, and holds the fibre optic cables 700 in such a manner that the fibre optic cables 700 can slide relative to each other.

The cable group 706 includes a plurality of cable layers 702 each of which is made up of a plurality of fibre optic cables 700 arranged in the arrangement direction C. The plurality of cable layers 702 are layered in the overlapped direction B. The slide sheet 704 is provided between the cable layers 702. Together with the cable containing chain 204, the slide sheets 704 hold the plurality of cable layers 702 in such a manner that the cable layers 702 can slide relative to each other. Here, it is preferable that the friction coefficient of the surface of the slide sheet 704 is smaller F than the friction coefficient of the surface of the fibre optic cable 700. In addition, it is desirable that the minimum bending radius of the slide sheet 704 is larger than the allowable bending radius of the fibre optic cable 700, that is, the slide sheets 704 are more bendable than the fibre optic cables 700.

The fibre optic cable unit 106 shown in FIG. 2 is configured in such a manner that the flat cables 200, each of which includes the fibre optic cables tied up together in the arrangement direction C, are layered in the overlapped direction B. On the other hand, the fibre optic cable unit 106 shown in FIG. 5 is configured in such a manner that the fibre optic cables 700 are arranged in the arrangement direction C without being tied up together, and layered in the overlapped direction B with the slide sheet 704 between adjacent layers of the fibre optic cables 700. Providing the slide sheets 704 between the fibre optic cables 700 in the overlapped direction B has the following advantage. Even when the fibre optic cables 700, which are not the flat cables 200, are inserted into the cable containing chain 204, the fibre optic cables 700 can be held so as to slide relative to each other without disturbing the arrangement order of the fibre optic cables 700.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing a device under test, comprising:
   a test head for applying a test pattern to the device under test;
   a main frame for controlling a test sequence of said test head; and
   a fibre optic cable unit for optically coupling said main frame and said test head,
   wherein said fibre optic cable unit comprises:
   a cable group comprising a plurality of fibre optic cables layered in an overlapped direction, said fibre optic cable comprising a plurality of fibre optic cores arranged in the arrangement direction:
   a cable containing chain for holding said layered plurality of fibre optic cables so that said fibre optic cables can slide each other, said cable containing chain being bendable in the overlapped direction; and
   a slide sheet provided between said layered plurality of fibre optic cables, the slide sheet holding said layered plurality of fibre optic cables so that said plurality of fibre optic cables can slide each other.

2. A test apparatus as claimed in claim 1, wherein a minimum bending radius of said cable containing chain is larger than an allowable bending radius of said fibre optic cable.

3. The test apparatus as claimed in claim 1, wherein said cable group comprises:
   a first cable layer including a plurality of fibre optic cables arranged in the arrangement direction; and
   a second cable layer including a plurality of fibre optic cables arranged in the arrangement direction, said second cable layer being layered on said first cable layer in the overlapped direction, and
   the slide sheet is provided between said first and second cable layers.

4. The test apparatus as claimed in claim 1, further comprising a circumferential difference absorption apparatus for adjusting difference in circumferential length between said plurality of fibre optic cables with respect to a part of a section of said plurality of fibre optic cables not contained in said cable containing chain and absorbing difference in circumferential length between said plurality of fibre optic cables.

5. The test apparatus as claimed in claim 4, wherein said circumferential difference absorption apparatus fixes said cable containing chain, holds said plurality of fibre optic cables with respect to a part of the section of said plurality of fibre optic cables not contained in said cable containing chain so that said fibre optic cables are bent, and forms space between said plurality of fibre optic cables with respect to the bending section of said plurality of fibre optic cables, thereby absorbing the difference in circumferential length between said plurality of fibre optic cables.

6. A test apparatus for testing a device under test, comprising:
   a test head for applying a test pattern to the device under test;

a main frame for controlling a test sequence of said test head; and a fibre optic cable unit for optically coupling said main frame and said test head, wherein said fibre optic cable unit comprises:

a cable group comprising a plurality of fibre optic cables layered in an overlapped direction, said fibre optic cable comprising a plurality of fibre optic cores arranged in an arrangement direction; and a cable containing chain for holding said layered plurality of fibre optic cables so that said fibre optic cables can slide each other, said cable containing chain being bendable in the overlapped direction, said test apparatus further comprising a circumferential difference absorption apparatus for adjusting difference in circumferential length between said plurality of fibre optic cables with respect to a part of a section of said plurality of fibre optic cables not contained in said cable containing chain and absorbing difference in circumferential length between said plurality of fibre optic cables.

7. A test apparatus as claimed in claim 6, wherein said circumferential difference absorption apparatus fixes said cable containing chain, holds said plurality of fibre optic cables with respect to a part of the section of said plurality of fibre optic cables not contained in said cable containing chain so that said fibre optic cables are bent, and forms space between said plurality of fibre optic cables with respect to the bending section of said plurality of fibre optic cables, thereby absorbing the difference in circumferential length between said plurality of fibre optic cables.

8. The test apparatus as claimed in claim 6, wherein a minimum bending radius of said cable containing chain is larger than an allowable bending radius of said fibre optic cable.

9. A cable guide unit for holding a plurality of fibre optic cables in a bent state, the fibre optic cables respectively coupled to a plurality of connectors of a fibre optic cable connection board, the connectors being arranged in an arrangement direction, comprising:

a plurality of cable hanger members for respectively bending and holding the plurality of fibre optic cables so that a minimum curvature radius of said cable hanger member is larger than an allowable bending radius of the fibre optic cable; and a cable hanger holding plate for holding the cable hanger members, wherein said plurality of cable hanger members are provided in the arrangement direction at substantially same arrangement intervals as those of the plurality of connectors, and wherein said plurality of cable hanger members are arranged in the coupling direction on positions shifted by narrower intervals than the arrangement intervals in the arrangement direction.

10. A cable guide unit as claimed in claim 9, further comprising:

a first cable hanger members; and a second cable hanger member group comprising said plurality of cable hanger members, wherein said first cable hanger member group provided on a position far from a bending end of the plurality of fibre optic cables is provided higher than said second cable hanger member group along the arrangement direction, and said second cable hanger member group being provided on a position close to the bending end of the plurality of fibre optic cables, wherein said cable hanger member of said second cable hanger member group has a narrower width than that of said cable hanger member of said first cable hanger member group, and the plurality of fibre optic cables bent by said first cable hanger member group pass by said second cable hanger member group and are led out of said cable guide unit.

11. A cable guide unit as claimed in claim 9, further comprising:

a first cable hanger member group comprising said plurality of cable hanger members; and a second cable hanger member group comprising said plurality of cable hanger members, wherein said first cable hanger member group provided on a position far from a bending end of the plurality of fibre optic cables is provided higher than said second cable hanger member group along the arrangement direction, said second cable hanger member group being provided on a position close to the bending end of the plurality of fibre optic cables, and the plurality of fibre optic cables bent by said first cable hanger member group pass by said second cable hanger member group and are led out of said cable guide unit, further comprising a clamp member for tying up the plurality of fibre optic cables bent by said first cable hanger member group and the plurality of fibre optic cables bent by said second cable hanger member group and leading the fibre optic cables out of said cable guide unit.

* * * * *

UNITED STATES PATENT AND TRADEMARK OFFICE
CERTIFICATE OF CORRECTION

PATENT NO. : 7,286,742 B2
APPLICATION NO. : 11/415372
DATED : October 23, 2007
INVENTOR(S) : Masashi Shibata et al.

Page 1 of 1

It is certified that error appears in the above-identified patent and that said Letters Patent is hereby corrected as shown below:

In the Claims:

In Claim 10, column 10, line 7, the words, "members; and" should be --member group comprising said plurality of cable hanger members; and--.

Signed and Sealed this

Fourth Day of March, 2008

JON W. DUDAS
*Director of the United States Patent and Trademark Office*